(12) United States Patent
Forster

(10) Patent No.: US 7,298,266 B2
(45) Date of Patent: Nov. 20, 2007

(54) RFID COMMUNICATION SYSTEMS AND METHODS

(75) Inventor: Ian J. Forster, Chelmsford (GB)

(73) Assignee: Avery Dennison, Pasadena, CA (US)

( * ) Notice: Subject to any disclaimer, the term of this patent is extended or adjusted under 35 U.S.C. 154(b) by 229 days.

(21) Appl. No.: 11/125,566

(22) Filed: May 9, 2005

(65) Prior Publication Data

US 2006/0250245 A1 Nov. 9, 2006

(51) Int. Cl.
G08B 13/14 (2006.01)

(52) U.S. Cl. .................... 340/572.1; 340/505; 340/514

(58) Field of Classification Search ............ 340/572.1, 340/505, 514, 428, 593, 501; 235/451, 375, 235/383
See application file for complete search history.

(56) References Cited

U.S. PATENT DOCUMENTS

| | | | |
|---|---|---|---|
| 4,802,216 A | 1/1989 | Irwin et al. | |
| 5,983,363 A | 11/1999 | Tuttle et al. | |
| 6,104,291 A | 8/2000 | Beauvillier et al. | |
| 6,219,543 B1 | 4/2001 | Myers et al. | |
| 6,236,223 B1 | 5/2001 | Brady et al. | |
| 6,246,326 B1 | 6/2001 | Wiklof et al. | |
| 6,326,889 B1 * | 12/2001 | Van Horn et al. | 340/572.1 |
| 6,346,881 B1 | 2/2002 | Davidson | |
| 6,359,561 B2 * | 3/2002 | Tuttle et al. | 340/572.1 |
| 6,409,401 B1 | 6/2002 | Petteruti et al. | |
| 6,412,086 B1 | 6/2002 | Friedman et al. | |
| 6,445,297 B1 | 9/2002 | Nicholson | |
| 6,486,769 B1 | 11/2002 | McLean | |
| 6,487,681 B1 | 11/2002 | Tuttle et al. | |
| 6,545,605 B2 | 4/2003 | Van Horn et al. | |
| 6,593,853 B1 | 7/2003 | Barrett et al. | |
| 6,784,789 B2 | 8/2004 | Eroglu et al. | |
| 6,806,812 B1 | 10/2004 | Cathey | |
| 7,132,946 B2 | 11/2006 | Waldner et al. | |
| 7,151,442 B1 * | 12/2006 | Nguyen | 340/428 |
| 2001/0002108 A1 | 5/2001 | Tuttle et al. | |
| 2002/0167397 A1 | 11/2002 | Eroglu et al. | |
| 2002/0186004 A1 | 12/2002 | Prazeres da Costa | |
| 2004/0032443 A1 | 2/2004 | Moylan et al. | |
| 2004/0075607 A1 | 4/2004 | Cathey | |
| 2004/0178267 A1 | 9/2004 | Tsirline et al. | |
| 2004/0215350 A1 | 10/2004 | Roesner | |

(Continued)

FOREIGN PATENT DOCUMENTS

JP 2003/076947 3/2003

(Continued)

*Primary Examiner*—Anh V. La
(74) *Attorney, Agent, or Firm*—MacPherson Kwok Chen & Heid LLP; Greg J. Michelson

(57) ABSTRACT

Systems and methods are disclosed herein to provide radio frequency identification (RFID) communication techniques for RFID devices. For example, in accordance with an embodiment of the present invention, a RFID communication system includes a transmission system that provides a radio frequency signal to an RFID device and a detector circuit that detects a response to the radio frequency signal from the RFID device. A controller determines whether the RFID device is operational based on whether the response was detected by the detector circuit. The RFID communication system may be implemented within a handheld device, a manufacturing test system, or any device requiring RFID communication functionality, such as a printer or an applicator for RFID devices.

22 Claims, 4 Drawing Sheets

U.S. PATENT DOCUMENTS

| | | |
|---|---|---|
| 2005/0045723 A1 | 3/2005 | Tsirline et al. |
| 2005/0045724 A1 | 3/2005 | Tsirline et al. |
| 2005/0068179 A1 | 3/2005 | Roesner |
| 2005/0150102 A1 | 7/2005 | Bosco et al. |
| 2006/0012387 A1 | 1/2006 | Shanks |

FOREIGN PATENT DOCUMENTS

| | | |
|---|---|---|
| JP | 2003076946 | 3/2003 |
| JP | 2003/099719 | 4/2003 |
| JP | 2003/099720 | 4/2003 |
| JP | 2003/099721 | 4/2003 |
| JP | 2003/168082 | 6/2003 |
| JP | 2003/168098 | 6/2003 |
| JP | 2003/187213 | 7/2003 |
| JP | 2003/331220 | 11/2003 |
| WO | WO 00/28339 | 5/2000 |
| WO | WO 01/65517 | 9/2001 |
| WO | WO 02/14884 | 2/2002 |
| WO | WO 02/088762 | 11/2002 |
| WO | WO 2004/084119 | 9/2004 |
| WO | WO 2004/088571 | 10/2004 |
| WO | WO 2004/095350 | 11/2004 |

\* cited by examiner

RFID COMMUNICATION SYSTEMS AND METHODS

TECHNICAL FIELD

The present invention relates generally to radio frequency identification (RFID) applications and, more particularly, to techniques for communicating with RFID devices.

BACKGROUND

The use of radio frequency identification (RFID) devices (e.g., RFID tags, RFID labels, RFID chips, RFID straps, or RFID inlays) is growing rapidly, with RFID devices utilized in a wide variety of applications. However, one challenge associated with RFID devices is the manufacture and testing of the RFID devices in a high-volume and/or cost-effective manner.

For example, the RFID devices may be manufactured or otherwise closely positioned on a roll or sheet of material (e.g., a carrier web or roll format). A conventional method of testing RFID devices during the manufacturing process involves bi-directional communication with each of the RFID devices at one or more defined frequencies and radio frequency power levels. However, the bi-directional communication technique of activating and reading the complete response from the RFID device is time consuming and requires a specialized RFID reader that is expensive and may not be optimized for rapid testing.

Furthermore, because the RFID reader is expensive, the number of RFID readers is typically limited and utilized sparingly to serially test the RFID devices, with each of the RFID devices sequentially positioned into test position or the RFID reader sequentially moved from one RFID device to the next in a designated test area. Thus, the testing process may be limited in terms of the number of RFID devices that can be tested in a cost effective manner.

Additionally, any device that incorporates an RFID reader, such as for example a printer that prints on RFID labels, may have a significant increase in price due to the cost of the RFID reader. Consequently, conventional RFID communication techniques may be limited in terms of cost and/or in the number of RFID devices that can be tested. As a result, there is a need for improved communication techniques for RFID devices.

SUMMARY

Systems and methods are disclosed herein to provide radio frequency identification (RFID) communication techniques for RFID devices. For example, in accordance with an embodiment of the present invention, a communication system is disclosed that can communicate with an RFID device and program and/or determine if it is defective based upon whether the RFID device responds when expected. As an example, by not receiving and decoding the complete response, the time required to communicate with the RFID device is decreased, which may reduce test time and test equipment costs and allow cost-effective programming and/or testing (e.g., high-speed parallel testing) of a large number of RFID devices. Furthermore, the RFID communication techniques disclosed herein allow the manufacture of RFID communication devices, which may be formed as discrete devices (e.g., a portable, handheld device) or incorporated into devices (e.g., a printer for RFID labels) to provide cost-effective RFID communication functionality.

More specifically, in accordance with one embodiment of the present invention, a RFID communication system includes a transmission system for providing a radio frequency signal to an RFID device; a detector circuit, coupled to the transmission system, adapted to detect a response to the radio frequency signal from the RFID device; and a controller, coupled to the detector circuit, adapted to determine whether the RFID device is operational based on whether the response was detected by the detector circuit.

In accordance with another embodiment of the present invention, a RFID communication system includes means for providing a radio frequency signal to at least one RFID device; means for detecting if the at least one RFID device responds to the radio frequency signal; and means for determining if the at least one RFID device is operational and/or programmed based on whether the at least one RFID device responds.

In accordance with another embodiment of the present invention, a method of performing RFID device communication includes providing a radio frequency signal to at least one RFID device; detecting if the at least one RFID device begins to respond to the radio frequency signal; and determining if the at least one RFID device is operational and/or programmed based upon whether the at least one RFID device begins to respond to the radio frequency signal.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
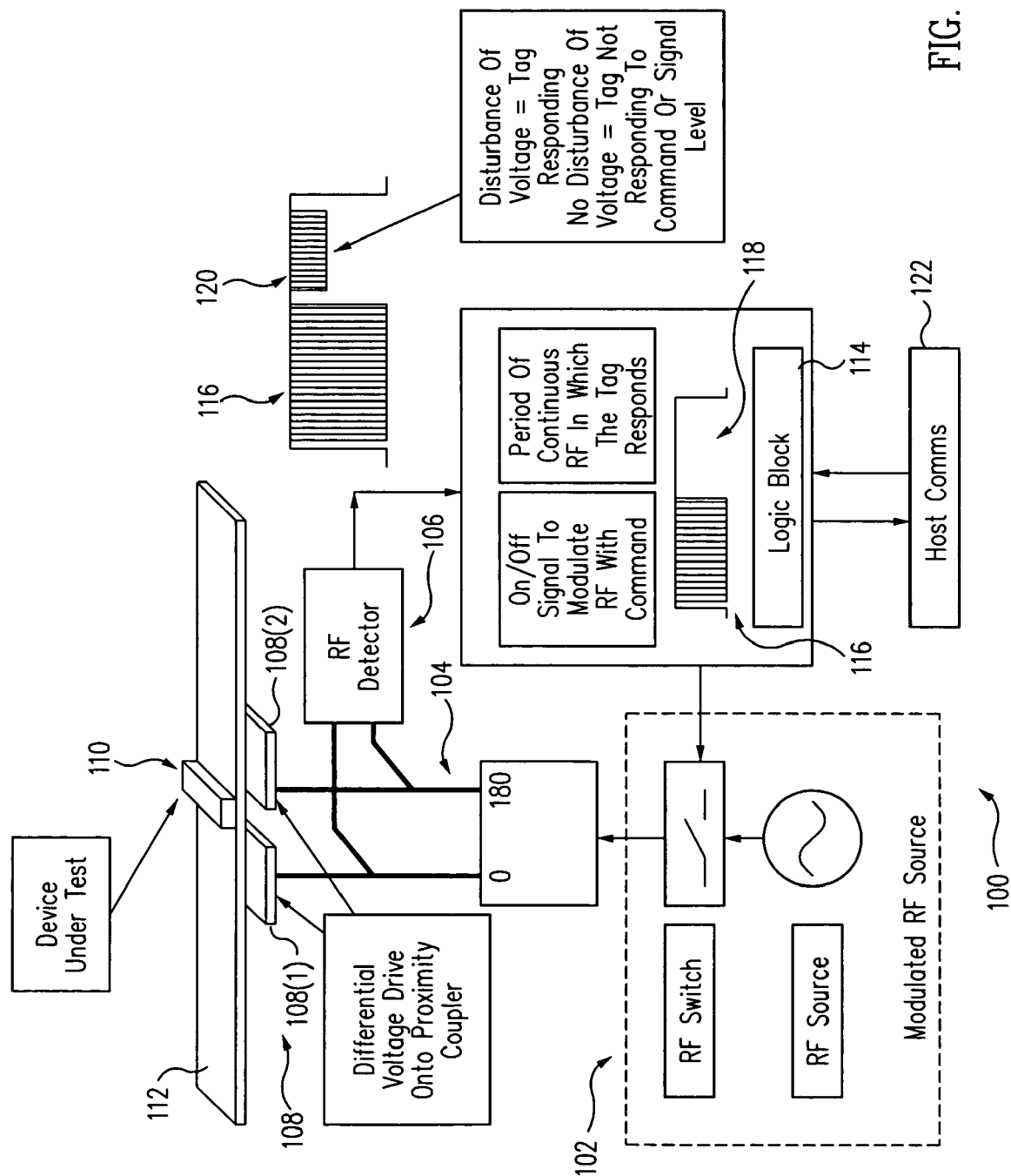
FIG. 1 shows a block diagram illustrating an RFID communication system in accordance with an embodiment of the present invention.

FIG. 1 shows a block diagram illustrating a radio frequency identification (RFID) communication system 100 in accordance with an embodiment of the present invention. RFID communication system 100 includes a radio frequency (RF) transmitter 102, a signal path 104, an RF detector 106, and a coupler 108.

RF transmitter 102 represents any type of RF transmitter, as would be understood by one skilled in the art, which can provide an RF signal to an RFID device 110 (e.g., an RFID tag, an RFID label, an RFID chip, an RFID strap, or an RFID inlay). RF transmitter 102 may include an RF source, which can be modulated to provide a command to RFID device 110, and an RF switch.

The RF signal from RF transmitter 102 may be provided to RFID device 110, for example, via signal path 104 and coupler 108 (e.g., two proximity coupler plates separately referenced as couplers 108(1) and 108(2)). As an example, signal path 104 may represent two differential signal paths to provide coupler 108 (e.g., a proximity coupler) with the RF signal (e.g., a differential RF voltage drive of 0 and 180 degrees onto a proximity coupler).

Coupler 108 communicates with RFID device 110, for example, via short-range coupling (e.g., near field coupling techniques) as would be understood by one skilled in the art. Consequently, only RFID device 110 responds to the RF signal, while any other RFID devices in close proximity to RFID device 110 (e.g., such as other RFID devices on the roll) do not respond to the RF signal provided to RFID device 110.

For example, RFID device 110 may include an element 112, which, depending upon the type of the RFID device, may represent an antenna or a strap/interposer or other conducting portion of RFID device 110. Thus, coupler 108 may communicate with RFID device 110 via short-range coupling through element 112.

Coupler 108 may communicate, for example, to RFID device 110 through a gap in a metal shield through which the short-range coupling occurs, with the metal shield preventing the other RFID devices near RFID device 110 from receiving the RF signal provided to RFID device 110. Strips of metal to "short" the electric field, dielectric materials to de-tune or change the frequency, and high-permeability materials to interact magnetically and de-tune or change the frequency may also be employed, as would be understood by one skilled in the art.

Various conventional short-range coupling techniques are known and may be utilized to provide the RF signal from RF transmitter 102 to RFID device 110, as would be known by one skilled in the art. Additionally, communication between RF transmitter 102 and RFID device 110 via coupler 108 may be implemented as disclosed in U.S. patent application Ser. No. 10/367,515, filed Feb. 13, 2003, and entitled "RFID Device Tester and Method" and/or as disclosed in U.S. patent application Ser. No. 10/882,947, filed Jul. 1, 2004, and entitled "RFID Device Preparation System and Method," which are incorporated herein by reference in their entirety.

Figure 2:
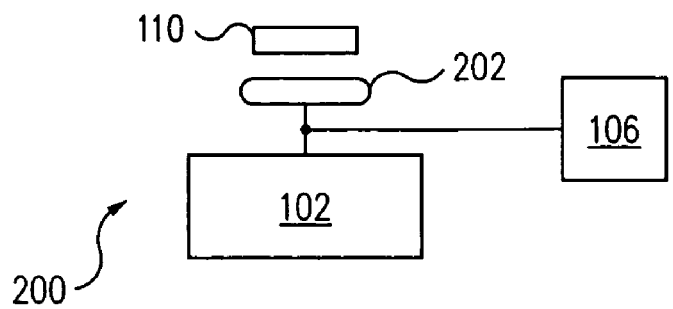
FIG. 2 shows a block diagram illustrating an RFID communication system in accordance with an embodiment of the present invention.

For example, referring briefly to FIG. 2, an RFID communication system 200 for providing near field coupling is illustrated in accordance with an embodiment of the present invention. RFID communication system 200 includes RF transmitter 102, RF detector 106, RFID device 110, and a coupler 202.

Coupler 202 may represent one or more pairs of couplers (e.g., coupler 108 or a number of couplers 108) to couple via an electric field with RFID device 110 (e.g., capacitively couple to element 112 of RFID device 110). Alternatively, or in addition, coupler 202 may represent a coil (e.g., single-turn coil or multi-turn coil) to couple via a magnetic field with RFID device 110 (e.g., inductively couple to element 112 of RFID device 110). Thus, coupler 202 may couple to RFID device 110 via an electric field, a magnetic field, or some combination of electric and magnetic fields (electromagnetic field), with coupler 202 providing the appropriate structure (e.g., parallel plates, single or multi-turn coils, transmission lines, or other types of structures). Furthermore, the signal frequency provided to RFID device 110 may be at a frequency different from the natural resonant frequency of RFID device 110, as discussed further in U.S. patent application Ser. Nos. 10/367,515 and 10/882,947.

Alternatively, coupler 108 may provide short-range coupling by making a direct connection with one or more conducting contact points of RFID device 110, as would be understood by one skilled in the art. For example, coupler 108 may make a direct connection with the antenna, the strap/interposer (e.g., conducting leads of the RFID device), or chip pads of RFID device 110, depending upon the type of RFID device being utilized. Thus, coupler 108 may provide short-range coupling in the near field via electric and/or magnetic fields or by direct connection with RFID device 110.

Referring back to FIG. 1, RFID communication system 100 may also include a controller 114, which may represent for example a processor-based system such as a computer system or other type of decision-making circuit such as a logic block, a programmable logic device, or an application specific integrated circuit. Controller 114 receives the results from RF detector 106 regarding each RFID device (e.g., RFID device 110) that is being tested or is otherwise being communicated with via coupler 108. Controller 114 may also control RF transmitter 102 to control the operation of RFID test system 100 and generate commands for RFID device 110.

RFID communication system 100 may also include a controller 122 that communicates with controller 114 (e.g., via a wireless or a wired interface). Controller 122 may represent an external device (e.g., a processor-based system or other controller-type device or decision-making circuit) that provides information to controller 114 and/or controls certain functions of RFID communication system 100. It should be understood that controller 114 and controller 122 may be combined and implemented within or external to RFID communication system 100. Furthermore, controller 114 and controller 122 may be implemented in hardware and/or in software to provide the controller functions for communication system 100.

RF detector 106 monitors signal path 104 and detects when RFID device 110 provides a response to the RF signal received from RF transmitter 102. For example, as illustrated in FIG. 1, RF transmitter 102 provides a modulated RF signal (e.g., a command signal) to RFID device 110, which prompts RFID device 110 to provide a response that is detected by RF detector 106. As discussed in further detail herein, RF detector 106 does not have to be implemented to receive and decode the complete response from RFID device 110, but rather simply detect that RFID device 110 responded to the RF signal from RF transmitter 102. If RFID device 110 responds or does not respond, then RFID device 110 passes the test or does not pass the test, respectively (e.g., response corresponds to satisfactory operation while no response corresponds to unsatisfactory operation).

In general, depending upon the type of RFID device being tested, RFID device 110 responds when sufficient energy is available to be rectified by RFID device 110 to serve as its power supply (e.g., a passive RFID device, although the techniques discussed herein are also applicable to active RFID devices) and an appropriate command is provided to RFID device 110. RFID device 110 responds, for example, by changing its input impedance using a data sequence, which in the far field results in a backscatter-modulated signal to be radiated while in the near field results in a change in the load presented to the source providing the RF signal to RFID device 110. The source (e.g., RF transmitter 102 or a driver circuit which may be included within an RF transmitter), depending upon its characteristics, may experience a change in the output voltage level or a change in the current drawn from it due to the changing load.

As illustrated in FIG. 1, in accordance with an embodiment of the present invention, RFID device 110 may be tested by applying an appropriately modulated RF signal, which results in a response if RFID device 110 is operational (e.g., a "good" RFID device). By simply detecting that RFID device 110 has responded, rather than reading the entire response (i.e., determining the data provided by RFID device 110) of RFID device 110, RF detector 106 may be implemented in a simple and inexpensive manner as compared to conventional test techniques utilizing expensive RFID readers (e.g., with complex receiver circuitry). Consequently, RFID device communication (e.g., testing) may be implemented as disclosed herein in a more cost effective manner and possibly in a faster and higher-volume manufacturing level.

For example, in accordance with an embodiment of the present invention, RF detector 106 detects the disturbance of the voltage level due to RFID device 110 responding (e.g., a digital 'good'/'bad' RFID device test). Thus, if RF detector 106 detects a response (e.g., a change in the digital state) from RFID device 110, then RFID device 110 is considered operational and passes the test. If RF detector 106 does not detect a response from RFID device 110 (e.g., no change in the digital state during the period a response should occur, as illustrated in FIG. 1), then RFID device 110 is considered defective and fails the test (e.g., failed to respond under the defined test conditions).

As an example, as illustrated in FIG. 1, an exemplary waveform 116 represents the RF signal (e.g., modulated with a command) provided by RF transmitter 102 to RFID device 110 and detected by RF detector 106. An exemplary waveform 118 represents the RF signal (e.g., a continuous RF signal level) provided by RF transmitter 102 to RFID device 110, during which RFID device 110 is expected to respond (e.g., as commanded). An exemplary waveform 120 represents the response provided by RFID device 110 and detected by RF detector 106, with the response indicating RFID device 110 is operational (e.g., response from RFID device 110 during period defined by waveform 118 and provided via coupler 108).

If RFID device 110 is not operational, then waveform 120 would be similar to waveform 118 (e.g., no response from RFID device 110). Furthermore, as explained herein, RF detector 106 does not have to retrieve the data in waveform 120 from RFID device 110, but rather simply detect a response (e.g., one or more voltage fluctuations) during the expected time period to determine that RFID device 110 is operational and responding to commands.

RF detector 106, for example, may be implemented as any type of conventional RF detector (e.g., a diode-based detector or an integrated circuit RF detector), as would be understood by one skilled in the art. In general, RF detector 106 provides a baseband voltage, which represents the amplitude of the RF signal rectified and integrated over time to remove voltage changes at the RF frequency and recover voltage changes due to the baseband signal modulation. The baseband voltage, for example, may be provided to a voltage comparator circuit, which will provide a digital signal (e.g., representing changes in the baseband signal).

Figure 3:
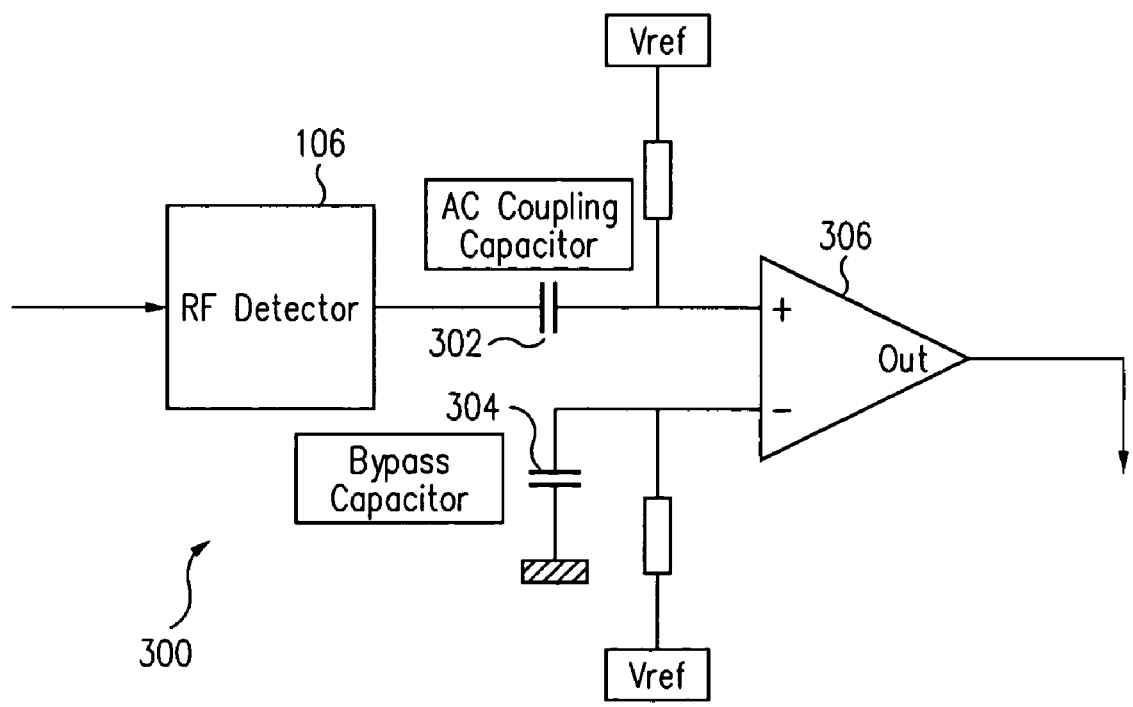
FIG. 3 shows a block diagram illustrating an RF detector circuit in accordance with an embodiment of the present invention.

As an exemplary implementation, referring briefly to FIG. 3, a block diagram of an RF detector circuit 300 is illustrated in accordance with an embodiment of the present invention. RF detector circuit 300 includes RF detector 106, a capacitor 302 (AC coupling capacitor), a capacitor 304 (bypass capacitor), and a voltage comparator 306. RF detector 106, for example, may be a diode-based detector or an integrated circuit RF detector, as would be understood by one skilled in the art, to convert the RF frequency (e.g., from RF transmitter 102 or RFID device 110) into a filtered voltage to recover the baseband modulation. The filtered voltage may be received by voltage comparator 306 to provide a digital signal representative of the baseband signal.

For example, when RFID device 110 modulates its impedance, the signal level on coupler 108 will change, which is detected by RF detector 106 and provided to voltage comparator 306 via capacitor 302. Voltage comparator 306 converts a small AC voltage (e.g., a few mV) into a logic level signal at its output to indicate that a changing RF signal is detected by RF detector 106. Voltage comparator 306 may have its input terminals biased to the same voltage level (e.g., Vref) and may have a certain level of hysteresis to prevent the output from changing due to noise.

Thus, when the RF signal level is constant or changing slowly, the digital output from voltage comparator 306 will remain in a constant state. However, the digital output from voltage comparator 306 will change states, for example, to track the baseband modulation provided to RFID device 110 or provided by RFID device 110 (e.g., in response to a command).

Returning to FIG. 1, RFID communication system 100 illustrates an approach for RFID device communication, for example, that provides parallel testing of a large number of RFID devices simultaneously at a relatively low cost and at a high efficiency. Consequently, utilizing the techniques disclosed herein may prevent the RFID device testing from becoming a limiting factor in terms of production speed or manufacturing cost.

Figure 4:
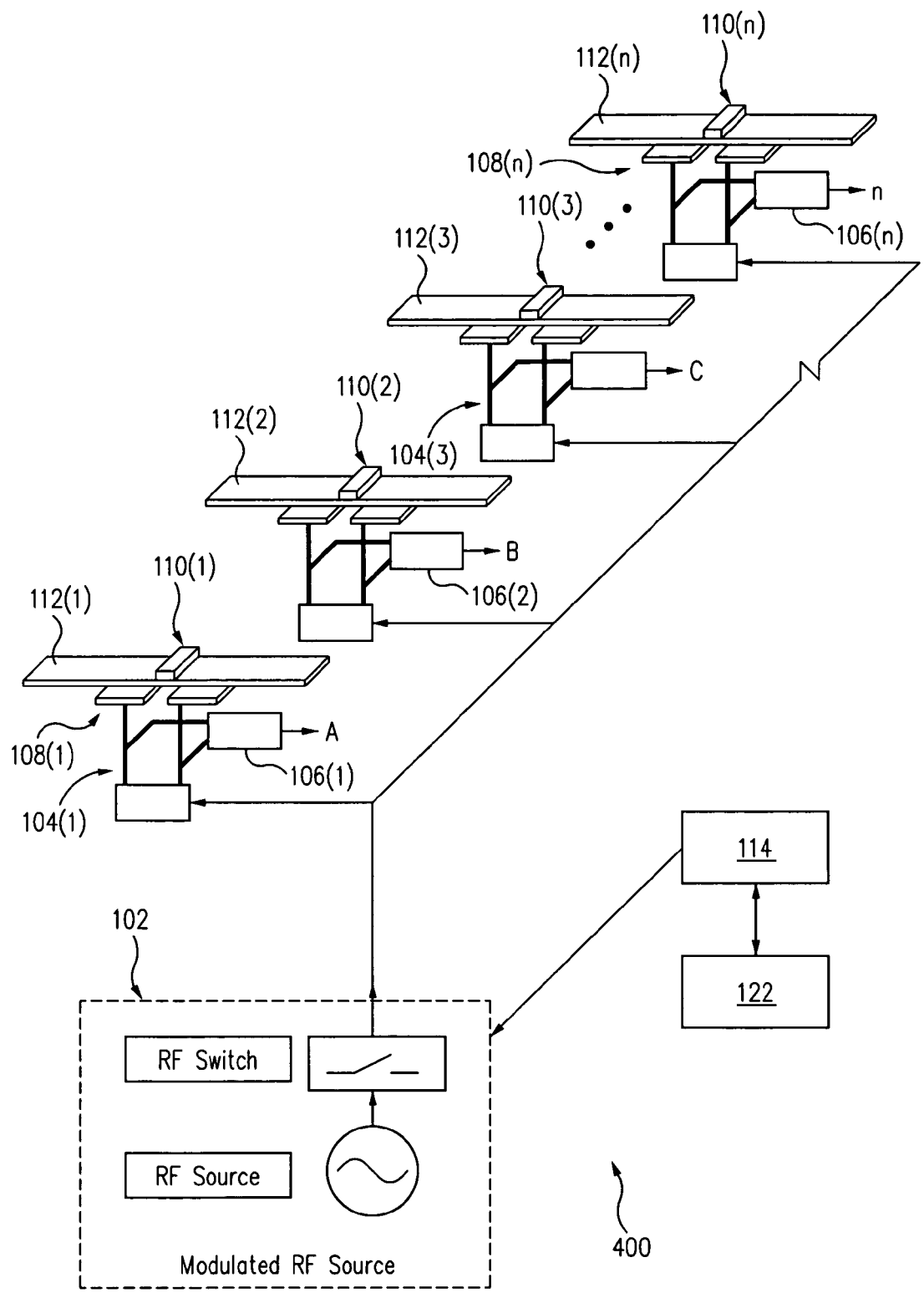
FIG. 4 shows a block diagram illustrating an RFID communication system in accordance with an embodiment of the present invention.

For example, FIG. 4 shows a block diagram illustrating an RFID communication system 400 in accordance with an embodiment of the present invention. RFID communication system 400 illustrates the techniques for testing a number of RFID devices 110, which are separately referenced as RFID devices 110(1) through 110(n), where "n" may represent any number of separate test stations for testing RFID devices 110.

RFID communication system 400 may utilize one or more of the techniques disclosed in reference to FIGS. 1-3 to provide a number of the parallel test stations. For example, RFID communication system 400 includes RF transmitter 102, which provides the RF signal to RFID devices 110(1) through 110(n) via corresponding signal paths 104(1) through 104(n) and couplers 108(1) through 108(n). By examining the test results provided by RF detectors 106(1) through 106(n) (e.g., output signals labeled A, B, C, . . . , through n), it can be determined whether corresponding RFID devices 110(1) through 110(n) pass or fail their tests. Thus, RFID communication system 400 may be implemented to test a large number of RFID devices simultaneously, which would allow a test system to meet the demands of high-speed manufacturing requirements (e.g., high-speed RFID inlay production technology).

As manufacturing speeds increase, additional time may be needed to deliver a sufficient amount of energy to the RFID devices (e.g., to energize or activate) before commencing communication. This can be achieved, for example in accordance with an embodiment of the present invention, by energizing the RFID devices prior to reaching the test positions.

Figure 5:
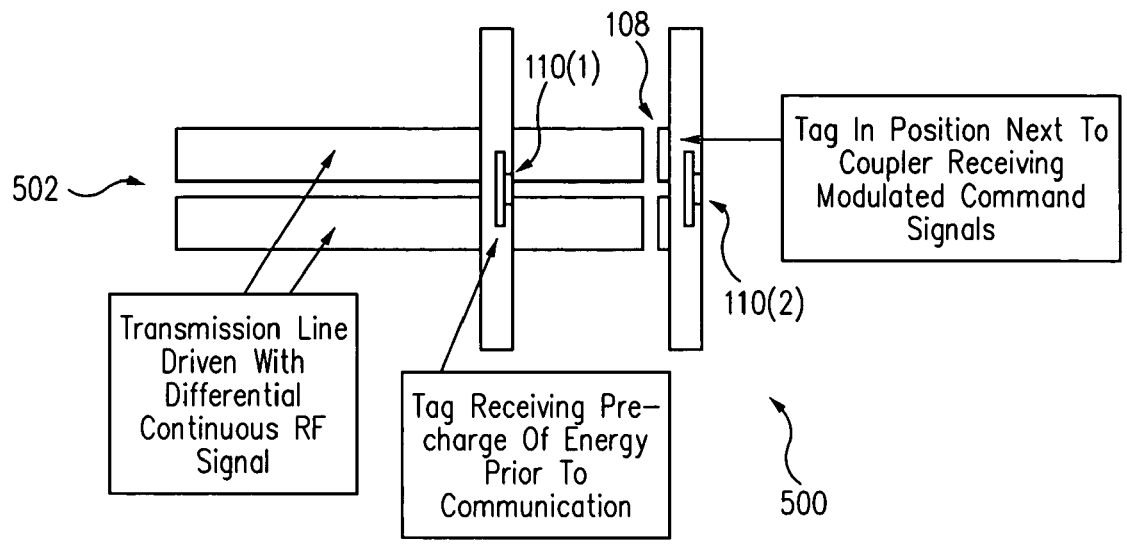
FIG. 5 shows a block diagram illustrating an RFID test technique, which may be applied for example to the RFID communication system of FIG. 4, in accordance with an embodiment of the present invention.

For example, FIG. 5 shows a block diagram illustrating an RFID communication system 500, which illustrates techniques that may be applied to RFID communication systems 100 and 400 (FIGS. 1 and 4), in accordance with an embodiment of the present invention. RFID communication system 500 includes a transmission line 502 (e.g., a pair of transmission lines) that is driven with a differential, continuous RF signal to energize the RFID devices near (e.g., traveling along) transmission line 502 prior to being tested.

As an example, RFID device 110(1) is shown receiving energy from transmission line 502 prior to being tested, while RFID device 110(2) is shown being tested and communicating via coupler 108 (as discussed herein, for example, in reference to FIG. 1). RFID device 110(2) received energy from transmission line 502 prior to reaching the test position over coupler 108, and therefore, may require less time prior to communicating with coupler 108 or less time within range of coupler 108.

In general, the communication techniques and protocols (e.g., commands, frequencies, power levels, and/or modulation scheme) depends upon the type of RFID device and/or the protocol that the RFID device is designed to accommodate. Furthermore, the techniques disclosed herein may be applied to short-range communication or long-range communication. In general, an antenna of the RFID device may be viewed as having a near field region and a far field region. The near field region refers to a reactive near field (e.g., approximately $R \leq \lambda/2\pi$) and a radiating near field (e.g., approximately $R < 2D^2/\lambda$), while the far field region refers to a radiating far-field component (e.g., approximately $R > 2D^2/\lambda$), where R is the distance from the antenna and D is the largest dimension of the antenna. Thus, short-range communication may generally involve the reactive near field, radiating near field, radiating far field, and/or a direct electrical connection, while long-range communication may generally involve the radiating far field.

One factor that may also influence the type of communication (e.g., testing) performed is the regulatory environment in the country (e.g., communication data rate, bandwidth, or power levels permitted for radio frequencies). For example, North America may permit RFID reader to RFID device data rates of approximately 140.35 kbps, while Europe may permit RFID reader to RFID device data rates of approximately 30 kbps for radiating systems. However, these limitations may not apply if near-field coupler techniques are utilized, for example, because the radiated energy may fall below the levels at which the regulatory rules are applied.

As an example of an exemplary application (e.g., in reference to FIG. 1), an RFID device test may be performed to verify general operation (e.g., an expected response to a command), which may include a write test to verify receipt and operation of various components of the RFID device (e.g., memory). As a specific implementation example, based on the electronic product code (EPC) Class 1 data specification and employing the XRA00 RFID chip from STMicroelectronics, a SCROLLALLID command sent to the RFID chip (e.g., represented by RFID device 110) will result in the RFID chip responding with its entire identification (ID) code (e.g., an 8-bit preamble, a 16-bit cyclic redundancy checksum, and a 96-bit ID).

As noted above, to determine that the RFID chip is operational (depending upon the test objectives), it may not be necessary to receive the entire response from the RFID chip. For example, to determine whether the RFID chip is operational (e.g., the RFID chip is good or bad), the test may be completed and the RFID chip moved beyond the range of the test station (e.g., beyond the range of coupler 108) after one or more bits have been received (e.g., one or more bits of the preamble detected). Thus, the test may be completed faster relative to conventional test techniques by determining whether the RFID chip is operational before the complete response has been received from the RFID chip.

A write test may also be performed, for example, on the RFID chip to determine whether various circuits are operational, such as the memory. By utilizing the techniques disclosed herein, in accordance with one or more embodiments of the present invention, the write test may be performed quickly for one or more of the RFID chips in parallel.

For example, as a specific implementation example (e.g., in reference to FIG. 1 or 4), the RFID chips may be programmed (by couplers 108 or prior to arriving at the test station of couplers 108) by providing an ERASEID command to erase the entire memory array of the RFID chips (e.g., setting all bits to zero). The RFID chips may then be provided with a PROGRAMED command to program (e.g., simultaneously) the RFID chips with a defined ID (e.g., 96 bits all equal to one). The PROGRAMED, for example, may be provided to controller 114 from controller 122 or generated by controller 114. A SCROLLID command may then be sent with its masking selective ID set to the defined ID (e.g., to all ones) so that only the RFID chips that have successfully been programmed with the defined ID will respond (e.g., by modulating the RF carrier as discussed above). As disclosed herein, the entire response does not need to be detected, only that the RFID chip responds or starts to respond as expected. Therefore, the write test can be performed quickly and in a parallel fashion.

As another example, in accordance with an embodiment of the present invention, the RFID chips may be programmed utilizing transmission line 502 and/or a far field RFID programmer (e.g., RFID reader/writer) to provide a rapid technique for programming a valid identification into a large number of un-initialized RFID devices (e.g., RFID devices 110). This may provide certain advantages as RFID commands and processes may be more time efficient for RFID devices that have a valid identification rather than no identification or an invalid identification.

Furthermore, parallel programming techniques to program a large number of RFID devices 110 simultaneously may provide a more time-efficient process as typical programming times for individual RFID devices may range, for example, from 0.1 to 1 second. The parallel programming, for example, may be performed with individual couplers (e.g., coupler 108 of FIGS. 1 and 4), which may also verify the programming by confirming a response to the programmed identification, or with transmission lines (e.g., transmission line 502 of FIG. 5). For example, one transmission line may program a large number of the RFID devices (e.g., seventy or more simultaneously) and subsequent couplers may test the RFID devices to verify a response to the programmed identification (e.g., 10 ms or less verification check).

Figure 7:
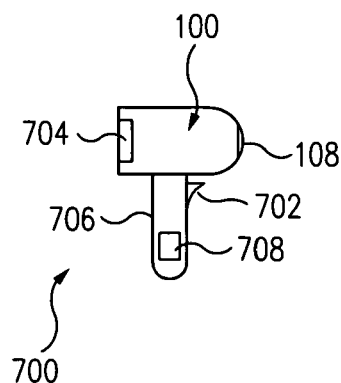
FIG. 7 shows a block diagram illustrating a portable RFID communication system in accordance with an embodiment of the present invention.

Returning to FIG. 1, RFID communication system 100 may be implemented within a communication system (e.g., a manufacturing test environment), incorporated within a device requiring RFID communication functionality (e.g., a printer printing on RFID labels and programming and/or testing the RFID devices), or as a discrete device (e.g., a portable, handheld RFID communication device). As an example, referring briefly to FIG. 7, a portable RFID communication system 700 is shown in accordance with an embodiment of the present invention. RFID communication system 700 represents an exemplary implementation of a portable, handheld device for providing RFID communication, which may include programming and/or testing the RFID devices.

RFID communication system 700 provides a compact housing, for example, for RFID communication system 100. A user would hold RFID communication system 700 by a handle 706 (e.g., containing a rechargeable battery 708) and employ a switch 702 when desired to communicate with an RFID device via coupler 108 (e.g., switch 702 controls transmission of the RF signal). A display 704 with user selectable functions may be provided as an interface for the user.

As another example, in accordance with one or more embodiments of the present invention, a low cost module may be provided as a discrete RFID communication device (e.g., as in FIG. 7) or for incorporation into printers, applicators, and any other type of device requiring RFID communication functionality (e.g., test and/or programming capability). The module may be provided at a lower cost as compared to conventional RFID readers to test and/or program RFID devices, because the receiver circuitry within the module is simplified to merely determine that the RFID device is responding to a command (rather than retrieving the data provided in the response as performed with conventional RFID readers). Thus, the module (e.g., RFID reader module) may be viewed as interacting with the RFID devices rather than reading them and, thus, may be referred to as a Tag Interaction Device (TID) or Tag Checker (TC), with tag referring generally to any type of RFID device.

The module may utilize the techniques disclosed herein, for example, to detect via a coupler the RFID device's response to a command. If a desired application (e.g., a printer or an applicator) does not require the retrieval of the data provided by the RFID device in its response, but merely verify that the RFID device responded (e.g., indication of proper operation), the module may be utilized to provide this RFID communication functionality.

For example, a printer for RFID devices may program an RFID device with an EPC code during the printing process (e.g., prior to printing on the RFID label). Typically, the RFID device is first erased and then a new EPC code (e.g., a 96-bit EPC) is programmed into the RFID device. In general, these commands do not require that the information be read back from the RFID device. Rather, to verify that the correct EPC code has been programmed into the RFID device, the module (i.e., TID) simply commands the RFID device with the matching EPC code it just programmed to respond back (e.g., and detect that the RFID device responded at an expected time). If the RFID device responds, then the RFID device must have been programmed successfully and, if the RFID device does not respond, then this implies that the RFID device was not programmed successfully (e.g., the RFID device is defective).

As a specific implementation example, in accordance with an embodiment of the present invention, a microcontroller with a UHF transmitter may be utilized to provide the basic functionality of RFID communication system 100. For example, Microchip Technology Inc. provides a microcontroller (e.g., rfPIC12F675H) having flash memory, internal RAM, a UHF ASK/FSK transmitter (AM modulated 850 MHz to 930 MHz PLL transmitter), A/D converter, and an analog comparator. The microcontroller may be mounted to coupler 108, for example, to provide a compact package for incorporation into a handheld device (e.g., as discussed in reference to FIG. 7) or within a printer or other device requiring RFID functionality.

The microcontroller may detect the response of an RFID device (e.g., RFID device 110) by detecting the load modulation caused by the RFID device via RF detector 106 coupled to the microcontroller. Alternatively, rather than utilize RF detector 106, the current drawn by (or voltage of) the RF amplifier within the microcontroller that drives coupler 108 may be monitored (e.g., by the A/D converter or analog comparator within the microcontroller) to detect the load modulation caused by the RFID device.

Figure 6:
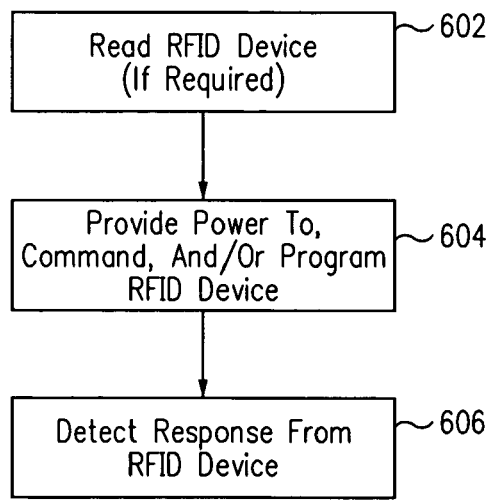
FIG. 6 shows a flowchart providing exemplary operations for an RFID communication system in accordance with an embodiment of the present invention.

FIG. 6 shows a flowchart 600 providing exemplary operations for an RFID communication system in accordance with an embodiment of the present invention. In general, flowchart 600 provides general operations that may be performed by an RFID communication system in accordance with one or more embodiments of the present invention. One or more of the general operations may be optional or performed in a different order, depending upon the test objectives or desired application.

For example, the RFID device may be read (block 602) if information is desired from the RFID device, such as its identification when preprogrammed. For example, an RFID reader may be employed to read the identification code of a preprogrammed RFID device or controller 122 (e.g., a host communication system) may provide the identification code of the RFID device.

The RFID device may be provided with energy (e.g., to power up) and programmed with a different identification and/or commanded to respond (block 604). The RFID device is monitored (block 606) after receiving the programming or command, for example, to detect the start or some portion of a response from the RFID device.

In general, systems and methods are disclosed herein to provide RFID communication techniques. For example, in accordance with an embodiment of the present invention, an RFID device may be tested by providing a defined level of energy and a command, with the RFID device's response detected. It is not necessary to receive the complete reply of the RFID device, but simply that the RFID device has responded.

This technique allows considerable simplification of test systems, which may reduce costs and reduce the time required for testing. For example, rather than requiring an RFID reader to communicate with every RFID device in a test position, either sequentially by scanning a reader through many tags or in parallel by using multiple readers, a common data command may be provided to a large number of RFID devices simultaneously. A simple circuit may then detect the fact that the RFID device has either responded or not (e.g., not receive the entire reply data), which determines whether the RFID device is judged to be good or bad.

Furthermore, the technique may be applied to programming tests. For example, a common program command may be issued to a number of the RFID devices (e.g., inserting the same ID into their memory). A command is then provided to the RFID devices with the same ID to respond. Because only the RFID devices that have been successfully written to respond, a simultaneous write test has been achieved.

The techniques disclosed herein may be applied to a wide range of applications, in accordance with an embodiment of the present invention. For example, the techniques may be employed to provide a discrete device, such as a handheld RFID communication device, or may be implemented within a manufacturing test system or a device requiring RFID functionality (e.g., a printer or an applicator).

Embodiments described above illustrate but do not limit the invention. It should also be understood that numerous modifications and variations are possible in accordance with the principles of the present invention. Accordingly, the scope of the invention is defined only by the following claims.

I claim:

1. A radio frequency identification (RFID) communication system comprising:
   a transmission system for providing a radio frequency signal to an RFID device;
   a detector circuit, coupled to the transmission system, adapted to detect a response to the radio frequency signal from the RFID device; and
   a controller, coupled to the detector circuit, adapted to determine whether the RFID device is operational based on whether a portion of the response was detected by the detector circuit.

2. The RFID communication system of claim 1, wherein the transmission system comprises:
   a radio frequency transmitter; and
   a coupler, coupled to the radio frequency transmitter, adapted to receive the radio frequency signal from the radio frequency transmitter and provide via short-range coupling the radio frequency signal to the RFID device.

3. The RFID communication system of claim 2, wherein the coupler communicates with the RFID device in a near field region by at least one of an electric field, a magnetic field, and a direct electrical connection.

4. The RFID communication system of claim 1, wherein the detector circuit comprises:
   a radio frequency detector; and
   a voltage comparator coupled to the radio frequency detector and adapted to provide an output signal to the controller.

5. The RFID communication system of claim 1, wherein the detector circuit monitors at least one of a current and a voltage associated with the transmission system to detect the response from the RFID device.

6. The RFID communication system of claim 1, wherein the detector circuit detects the portion of the response from the RFID device and the controller determines whether the RFID device is operational without decoding the portion of the response.

7. The RFID communication system of claim 1, further comprising a second transmission system adapted to provide at least one of an energy source and a program command to the RFID device.

8. The RFID communication system of claim 1, wherein the RFID communication system comprises a handheld, portable device.

9. The RFID communication system of claim 1, wherein the RFID communication system is formed as part of at least one of a printer, an applicator, and a manufacturing test system.

10. A radio frequency identification (RFID) communication system comprising:
    means for providing a radio frequency signal to at least one RFID device;
    means for detecting if the at least one RFID device begins to respond to the radio frequency signal; and
    means for determining if the at least one RFID device is operational and/or programmed based on whether the at least one RFID device begins to respond.

11. The RFID communication system of claim 10, wherein the providing means comprises at least one short-range coupler for providing the radio frequency signal to the at least one RFID device.

12. The RFID communication system of claim 10, wherein the determining means further comprises:
    means for programming the at least one RFID device to store a first value; and
    means for commanding the at least one RFID device to respond to verify that the at least one RFID device has been programmed.

13. The RFID communication system of claim 10, wherein the RFID communication system comprises a handheld, portable device.

14. The RFID communication system of claim 10, wherein the RFID communication system is formed as part of at least one of a printer, an applicator, and a manufacturing test system.

15. The RFID device communication system of claim 10, further comprising means for energizing the at least one RFID device prior to providing the radio frequency signal to the at least one RFID device.

16. A method of performing radio frequency identification (RFID) device communication, the method comprising:
    providing a radio frequency signal to at least one RFID device;
    detecting if the at least one RFID device begins to respond to the radio frequency signal; and
    determining if the at least one RFID device is operational and/or programed based upon whether the at least one RFID device begins to respond to the radio frequency signal.

17. The method of claim 16, further comprising:
    providing a programming command to program the at least one RFID device;
    commanding the at least one RFID device to respond based on the programming; and
    determining if the programming is successful for the at least one RFID device based upon whether the at least one RFID device begins to respond to the commanding.

18. The method of claim 16, wherein any reply to the radio frequency signal from the at least one RFID device is detected via short-range coupling.

19. The method of claim 16, wherein the determining is based on the detection of any portion of a response from the RFID device.

20. The method of claim 16, further comprising providing a second radio frequency signal prior to the first radio frequency signal to provide power to the RFID device.

21. The method of claim 16, wherein the RFID communication is performed within at least one of a handheld device, a printer, a manufacturing RFID test system, and an applicator.

22. The method of claim 16, further comprising receiving control signals from an external device.

* * * * *